United States Patent
Kohler et al.

(10) Patent No.: US 7,930,615 B2
(45) Date of Patent: Apr. 19, 2011

(54) MEMORY DEVICE WITH ERROR CORRECTION CAPABILITY AND PREEMPTIVE PARTIAL WORD WRITE OPERATION

(75) Inventors: Ross A. Kohler, Allentown, PA (US); Richard J. McPartland, Nazareth, PA (US); Wayne E. Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 992 days.

(21) Appl. No.: 11/756,011

(22) Filed: May 31, 2007

(65) Prior Publication Data

US 2008/0301526 A1 Dec. 4, 2008

(51) Int. Cl.
*G11C 29/00* (2006.01)
(52) U.S. Cl. .................................................... 714/763
(58) Field of Classification Search .................. 714/763, 714/764
See application file for complete search history.

(56) References Cited

U.S. PATENT DOCUMENTS

| 7,254,763 B2 | 8/2007 | Aadsen et al. |
| 7,275,200 B2 | 9/2007 | Leung |
| 7,392,456 B2 | 6/2008 | Leung et al. |
| 7,610,542 B2 * | 10/2009 | Nagai ........................... 714/763 |
| 2008/0168331 A1 * | 7/2008 | Vogelsang et al. ............ 714/770 |

OTHER PUBLICATIONS

PCT International Application No. PCT/US07/67502 filed in the name of R.A. Kohler et al. on Apr. 26, 2007 and entitled "Memory Device with Error Correction Capability and Efficient Partial Word Write Operation."

* cited by examiner

*Primary Examiner* — Shelly A Chase
(74) *Attorney, Agent, or Firm* — Ryan, Mason & Lewis, LLP (57) ABSTRACT

A memory device comprises a memory array and error correction circuitry coupled to the memory array. The memory device is configured to perform a partial word write operation in which an error correction code encode process for the given retrieved word is initiated prior to completion of an error correction code decode process for the given retrieved word based on an assumption that the error correction code decode process will not indicate an error in the given retrieved word. If the error correction code decode process when completed indicates an error in the given retrieved word, the error in the given retrieved word is corrected in the error correction circuitry, and the error correction code encode process is restarted using the corrected word. The error correction code decode process and an associated correct process are thereby removed from a critical timing path of the partial word write operation.

22 Claims, 4 Drawing Sheets

MEMORY DEVICE WITH ERROR CORRECTION CAPABILITY AND PREEMPTIVE PARTIAL WORD WRITE OPERATION

FIELD OF THE INVENTION

The present invention relates generally to semiconductor memory devices, and more particularly to memory devices which incorporate error correction capability.

BACKGROUND OF THE INVENTION

Semiconductor memory devices are subject to defects that may cause some memory cells to be read with incorrect data. Such defects are generally discovered during post-manufacture testing of integrated circuit memory devices. Defective memory devices may need to be discarded, thereby reducing the yield of the integrated circuit manufacturing process, and increasing the net manufacturing costs for the non-defective devices.

A number of techniques are known for configuring a memory device to remain operative in the presence of defects. One such technique involves incorporating redundant lines, rows or blocks of cells into the device. This allows lines, rows or blocks having defective cells to be replaced with corresponding non-defective redundant elements. Volatile or non-volatile switching elements may be used to implement the replacement.

Another technique for dealing with defects in memory devices involves utilizing error correction coding (ECC) to correct data errors attributable to defects. Examples of this type of approach are disclosed in U.S. Patent Application Publication No. 2006/0048031, entitled "Built-In Self-Test for Memory Arrays Using Error Correction Coding," which is commonly assigned herewith and incorporated by reference herein.

It is generally desirable to support partial word write operations on memory devices that include error correction capability. A partial word write operation occurs when one or more, but not all, of the bits in a word are to be written. The remaining bits in the word are not changed but remain at their previous values. Examples of partial word write operations include byte write operations and bit write operations.

Memory devices that incorporate ECC typically require two cycles of an external clock to perform a partial word write operation, namely, a first cycle for a read phase of the partial word write operation and a second cycle for a write phase of the partial word write operation. Requiring two clock cycles is disadvantageous because it slows down the data transfer rate between the memory device and a higher-level system that incorporates or otherwise utilizes that device. For example, two external cycles may be used to perform a given partial word write operation. However, this approach slows the data transfer rate by a factor of two, by requiring a no-operation (NOOP) cycle following the cycle that initiates the partial word write operation. Alternatively, the external cycle time specification for the memory device may be increased by a factor of two, and thus its external clock frequency may be reduced by a factor of two to allow time for the two cycles to occur internally to the device. Unfortunately, this approach also slows the data transfer rate by a factor of two.

A number of techniques are known in the art for reducing the time needed to perform a partial word write operation in a memory device that incorporates ECC. These techniques generally allow the write phase of the partial word write operation to be accomplished in a time somewhat shorter than a full cycle, and thus the partial word write operation can be executed in somewhat less than two cycles.

One such technique is disclosed in U.S. Patent Application Publication No. 2006/0112321, entitled "Transparent Error Correcting Memory That Supports Partial-Word Write," which is incorporated by reference herein. This technique involves keeping particular sense amplifiers and rows of the memory device active from the read phase through the write phase, whereas normally they would have been deactivated at the end of the read phase and reactivated at the beginning of the write phase.

Another technique for reducing the time needed to perform a partial word write operation is referred to as predictive ECC, and is described in U.S. Patent Application Publication No. 2006/0123322, entitled "Predictive Error Correction Code Generation Facilitating High-Speed Byte-Write in a Semiconductor Memory," which is incorporated by reference herein. This technique allows ECC decode of a read word to be performed at the same time as ECC encode of the word to be written, thereby reducing the overall time required to complete the partial word write operation.

In the predictive ECC technique, the elapsed time for a partial word write operation is reduced by an amount given by the shorter of (i) the combined duration of an ECC decode process and its associated correct process, and (ii) the duration of an ECC encode process. Typically, the duration of the ECC encode process is shorter than the combined duration of the ECC decode and correct processes, and thus the improvement provided by the predictive ECC technique is limited to the duration of the shorter ECC encode process. The ECC decode and correct processes remain in the critical timing path of the partial word write operation.

Accordingly, a need exists for an improved approach to performing partial word write operations in memory devices with error correction capability.

SUMMARY OF THE INVENTION

The present invention in one or more illustrative embodiments provides techniques for improving the efficiency of partial word write operations in a memory device having error correction capability. These techniques utilize an approach that is referred to herein as a preemptive partial word write.

In accordance with one aspect of the invention, a memory device comprises a memory array and error correction circuitry coupled to the memory array. The memory device is configured to perform a partial word write operation in which an ECC encode process for the given retrieved word is initiated prior to completion of an ECC decode process for the given retrieved word based on an assumption that the ECC decode process will not indicate an error in the given retrieved word. If the ECC decode process when completed indicates an error in the given retrieved word, the error in the given retrieved word is corrected in the error correction circuitry, and the ECC encode process is restarted using the corrected word.

The ECC encode process in an illustrative embodiment comprises modifying one or more bits of a given retrieved dataword in accordance with new data to be written by the partial word write operation, and computing an ECC word for the modified retrieved dataword. In other embodiments, the ECC encode process need not explicitly include such modification of the retrieved dataword by the new data, but may instead involve simply computing an ECC word for a modified retrieved dataword supplied as an input to the process.

That is, modification of the retrieved dataword in accordance with the new data to be written may be performed outside of the ECC encode process.

In an illustrative embodiment, the partial word write operation comprises a read phase and a write phase, and the ECC encode process and the ECC decode process are performed at least in part in parallel with one another as part of the write phase of the partial word write operation. The write phase is interrupted if the ECC decode process indicates an error in the given retrieved word. This interruption of the write phase may be performed in conjunction with generation of a flag that requests a NOOP cycle for the memory device, with the requested NOOP cycle being utilized to restart and complete the write phase using a corrected word.

A memory device in accordance with the invention may be implemented, for example, as a stand-alone memory device, such as a packaged integrated circuit, or as an embedded memory in a processor or other device.

Advantageously, the preemptive partial word write approach removes the ECC decode process and its associated correct process from the critical timing path of the partial word write operation. The time required to perform a partial word write operation is thus typically reduced by the time required for the ECC decode and correct processes. It is expected that only a small percentage of retrieved datawords will actually contain errors, such that the additional NOOP cycle will be requested infrequently. The time required for most partial word write operations will be considerably reduced.

DETAILED DESCRIPTION OF THE INVENTION

The invention will be illustrated herein in conjunction with exemplary semiconductor memory devices and associated error correction circuitry. It should be understood, however, that the invention is more generally applicable to any semiconductor memory device, and may be implemented using error correction circuitry other than that specifically shown in conjunction with the illustrative embodiments.

The present invention may be implemented in memory devices of the type described in PCT International Application No. PCT/US07/67502, filed Apr. 26, 2007 and entitled "Memory Device with Error Correction Capability and Efficient Partial Word Write Operation," which is commonly assigned herewith and incorporated by reference herein. However, such devices are not required for implementation of the present invention.

Figure 1:
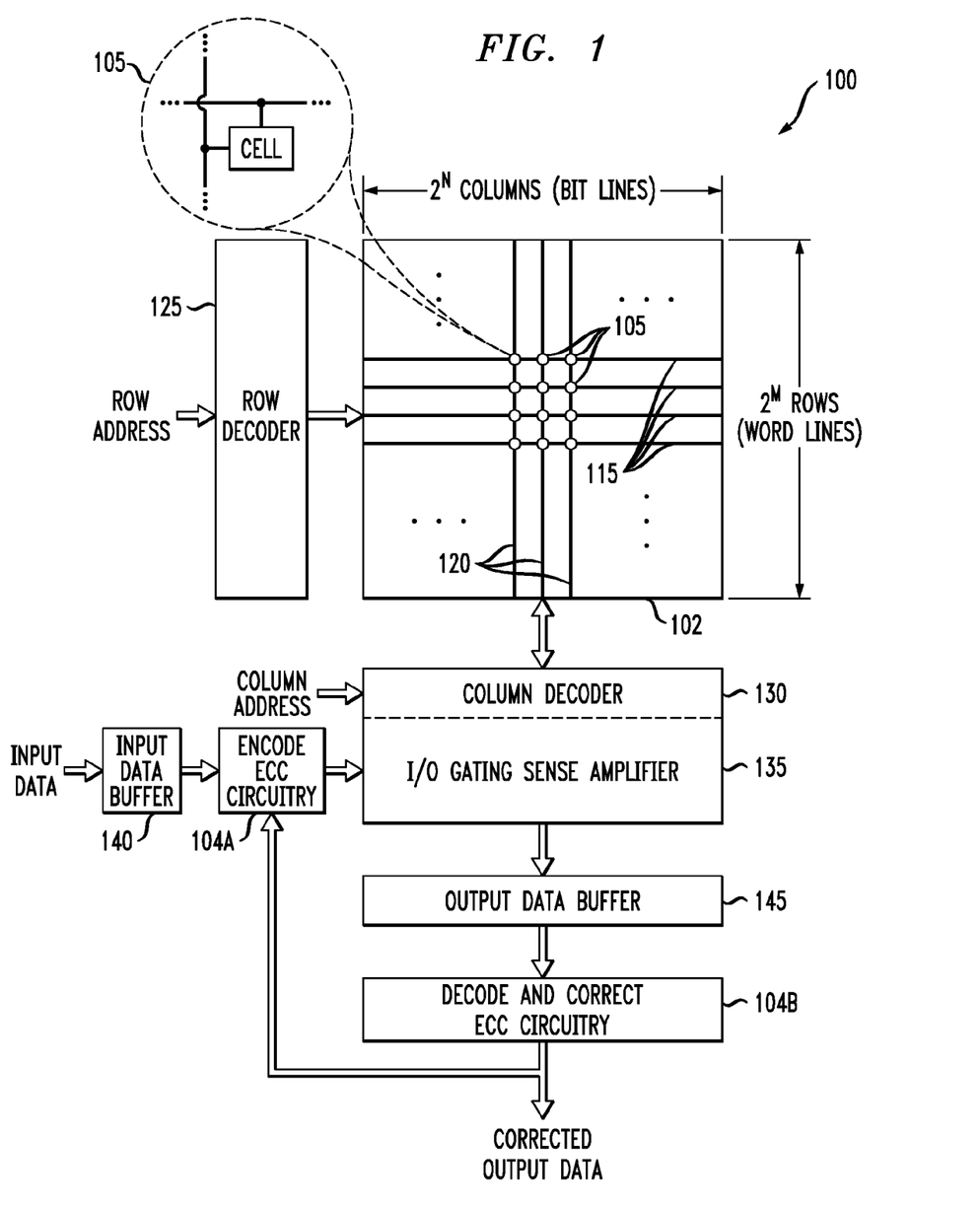
FIG. 1 shows a semiconductor memory device with error correction circuitry in an illustrative embodiment of the invention.

FIG. 1 shows a simplified diagram of a memory device 100 in accordance with an illustrative embodiment of the invention. The memory device 100 comprises a memory array 102 and error correction circuitry 104 coupled to the memory array. The error correction circuitry 104 in this embodiment more particularly includes encode ECC circuitry 104A and decode and correct ECC circuitry 104B. The memory array comprises a plurality of memory cells 105 configured to store data. The memory cells may each be configured to store a single bit of data, and such memory cells are also referred to herein as bit-cells. Each cell 105 is coupled to a corresponding row or wordline 115 and column or bitline 120. Particular ones of the cells can be activated for reading or writing of data therefrom by application of appropriate row and column addresses to respective row decoder 125 and column decoder 130. Other elements of the memory device 100 include a gating and sense amplifier element 135, an input data buffer 140 and an output data buffer 145. Numerous techniques for writing data to and reading data from cells of a memory array such as array 102 are well understood in the art and such techniques will therefore not be described in detail herein.

Although memory array 102 is identified in FIG. 1 as comprising the cells 105 and their associated wordlines and bitlines 115 and 120, the term "memory array" as used herein is intended to be broadly construed, and may encompass one or more associated elements such as input or output data buffers, column or row decoders, gating elements, sense amplifiers, etc. For example, as described in the above-cited PCT International Application No. PCT/US07/67502, a given implementation of memory array 102 may comprise local and global sense amplifiers, such that element 135 is distributed throughout the array rather than configured as a separate element as shown in FIG. 1.

It should be noted that the memory device 100 may comprise many types of stand-alone or embedded memory, including static or dynamic random access memory (SRAM or DRAM), electrically erasable programmable ROM (EEPROM), magnetic RAM (MRAM), ferroelectric RAM (FRAM), phase-change memory (PCRAM), etc. Also, other types of memory cell configurations may be used. For example, the memory cells in the array 102 could be multi-level cells each configured to store more than one bit of data. The invention is thus not limited in terms of the particular storage or access mechanism utilized in the memory device.

The decode and correct ECC circuitry 104B in this embodiment performs error detection and correction utilizing conventional ECC. The decode and correct ECC circuitry as shown receives output data from output data buffer 145. This output data may comprise, for example, one or more stored codewords retrieved by applying an appropriate read address comprising row and column addresses to the respective row and column decoders 125 and 130. The particular type of ECC used in a given embodiment is not critical, and any of a wide variety of well-known types of ECC may be used in implementing the invention. The encode ECC circuitry 104A is configured to generate the codewords from input data, and may be implemented in a conventional manner, as will be appreciated by those skilled in the art. Such codewords as well as datawords or other types of words are considered to be encompassed by the general term "word" as used herein.

The error correction circuitry 104 comprising portions 104A and 104B may be adapted for use in a partial word write operation of the type to be described herein. For example, this circuitry may perform an ECC encode process, as well as ECC decode and correct processes. Various techniques for performing such processes are well known. A given word retrieved from the memory array 102 in conjunction with a partial word write operation may be subject to an ECC decode process in portion 104B of the error correction circuitry 104, followed by an ECC correct process if an error is detected in the retrieved word. The retrieved word or a corrected version thereof may then be subject to an ECC encode operation in portion 104A before being written back into the memory array. Such an ECC encode operation is applied to one or more new data bits and the unchanged portion of the retrieved word as part of the partial word write operation.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. More specifically, as previously indicated, the invention can be implemented using many types of memory, and is not limited to any particular memory device configuration. Those skilled in the art will recognize that a wide variety of other memory device configurations may be used in implementing the invention.

The memory device 100 in the illustrative embodiment is configured to support a plurality of operations, including a read operation, a full word write operation, a partial word write operation and no-operation (NOOP). Other types of operations can be supported in alternative embodiments of the invention.

As indicated previously, conventional memory devices that incorporate predictive ECC are deficient in that such devices utilize a partial word write operation in which ECC decode and correct processes are part of the critical timing path that determines the duration of the operation. The illustrative embodiment overcomes this deficiency of the prior art by configuring the memory such that an ECC encode process of a partial word write operation is initiated for a given retrieved word prior to completion of an ECC decode process for the given retrieved word based on an assumption that the ECC decode process will not indicate an error in the retrieved word. Such an assumption is believed to be sound in that the number of retrieved words exhibiting an error is typically small, usually much less than 0.1% of the retrieved words. If the ECC decode process does in fact indicate an error in the retrieved word, the error in the retrieved word is corrected, and the ECC encode process is restarted using the corrected word. This type of arrangement is also referred to herein as preemptive partial word write.

The ECC encode process in the illustrative embodiment includes modifying one or more bits of a given retrieved dataword in accordance with new data to be written by the partial word write operation and computing an ECC word for the modified retrieved dataword. Other types of ECC encode processes may be used in implementing the invention. For example, an ECC encode process initiated for a given retrieved word may include only the generation of an ECC word for a modified retrieved word, with the modification occurring outside the ECC encode process.

Advantageously, the preemptive partial word write approach removes the ECC decode process and its associated ECC correct process from the critical timing path of the partial word write operation. The time required to perform a partial word write operation is thus typically reduced by the time required for the ECC decode and correct processes. As one example, partial word write time may be reduced by approximately 1 nanosecond in an embedded memory in a silicon system-on-chip integrated circuit.

The manner in which the memory device 100 implements partial word write operations will be described herein with reference to FIGS. 2 through 4. By way of introduction, various aspects of illustrative ECC and associated read and write operations in the memory device 100 will initially be described.

The memory device 100 in the illustrative embodiment incorporates error correction based on ECC by associating a certain number of parity bits, collectively referred to as an ECC word, with each full dataword. For example, a 32-bit dataword may have an additional 6 ECC bits for single-bit error detect and correct (SEC), or an additional 7 ECC bits for single-bit error correct with double-bit error detect (SECDED). The 32-bit dataword and 6 or 7 bit ECC word are merged into a 38 or 39 bit codeword. As indicated previously, numerous alternative ECC arrangements may be used in other embodiments.

The memory device 100 is operated under the control of an external clock signal. Such a clock signal may be supplied to the memory device from a higher-level system, or from another suitable clock signal source. It is also possible that such a clock signal may be supplied from a source internal to the memory device. In the present embodiment, it is assumed that each cycle of this clock signal initiates and completes a particular memory operation, such as a read operation, a write operation or a NOOP operation. Clock cycles usually occur continuously and sequentially, and are also referred to herein as "external cycles" or simply "cycles." All such cycles are considered to be within the scope of the general term "clock cycle of the memory device" as that term is used herein.

During a read operation, the codeword comprising the merged dataword and ECC word is read from a memory location indicated by a read address. The codeword is then provided to the decode and correct ECC circuitry 104B. This decode and correct ECC circuitry performs error detection and correction, and provides a corrected output dataword. Corrections are generally limited to one codeword bit being in error. Therefore valid data will be output from the memory device if there is no more than one bit in error in the codeword. Invalid data will be output if there is more than one bit in error in the codeword. A read operation occupies one full clock cycle of memory operation.

During a full word write operation, an ECC word is generated from a dataword. The ECC word is generated in the encode ECC circuitry 104A which may comprise, for example, an ECC word calculator (ECCWC). The dataword and ECC word are merged into the codeword which is then written into a memory location indicated by a write address. Like a read operation, a full word write operation occupies one full cycle of memory device operation.

As indicated previously, a partial word write is when one or more, but not all, of the bits in a dataword are to be written. The remaining bits in the dataword are not changed but remain at their previous values. In a memory device that does not have ECC, a partial word write is very similar to a full word write in that it is accomplished in a single cycle, but writing only some of the dataword bits. In a memory device that includes ECC, a partial word write operation normally requires two cycles. The first cycle is a read and correction of the pre-existing codeword as described above for a read operation. This read provides the corrected dataword which is to be modified by the selected bits to be written. This modified dataword is the new dataword. The second cycle comprises calculation of the new ECC word associated with the new dataword and the writing of the new codeword. The new dataword contains one or more bits from the original read operation and one or more new bits representing the partial word that is to be written. The new codeword is the merged new dataword and new ECC word. The two cycles of a typical partial word write operation in a memory device with ECC are more generally referred to herein as respective read and write phases of the partial word write operation.

Figure 2:
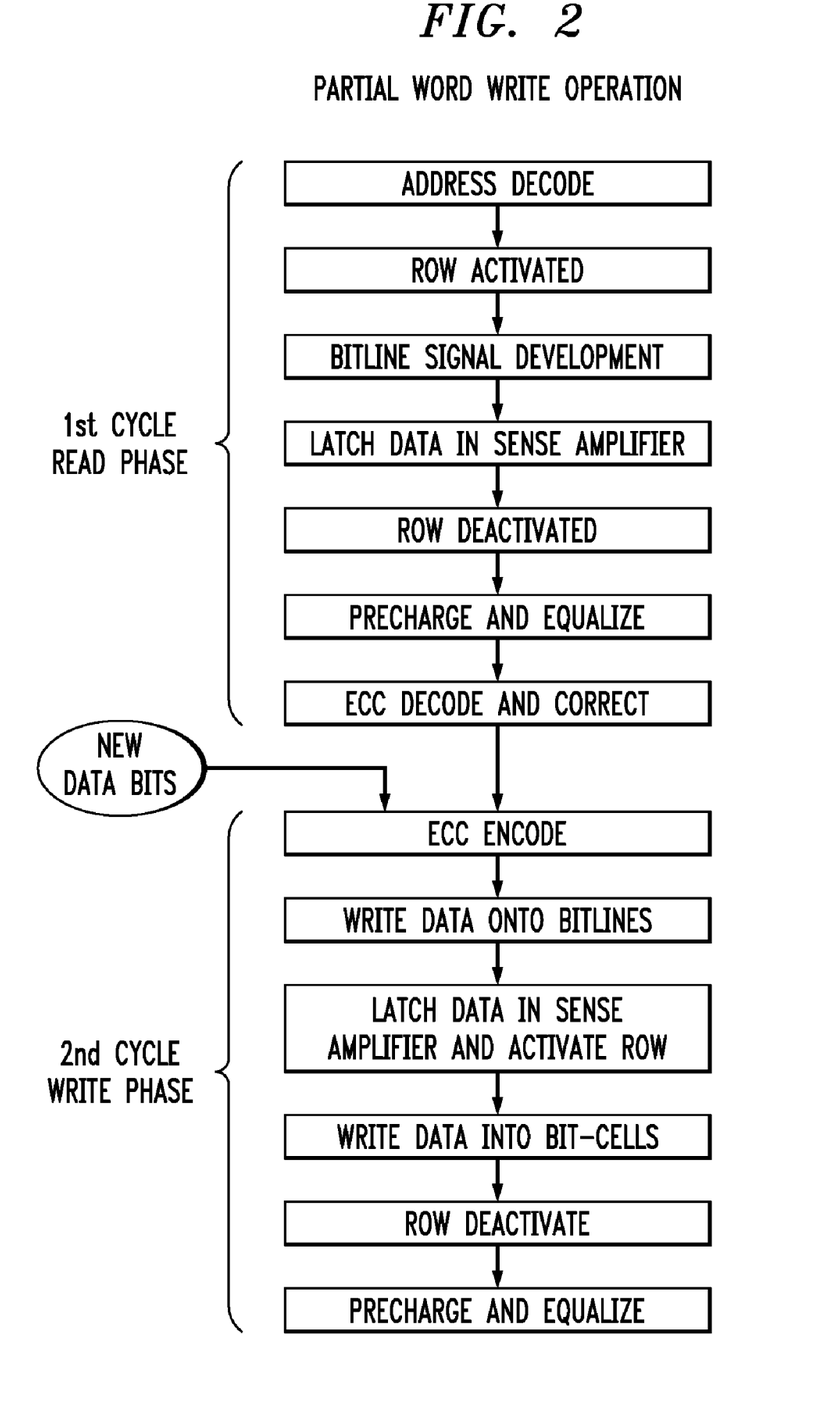
FIGS. 2 and 3 are flow diagrams of partial word write operations that may be implemented in the semiconductor memory device of FIG. 1.
Figure 3:
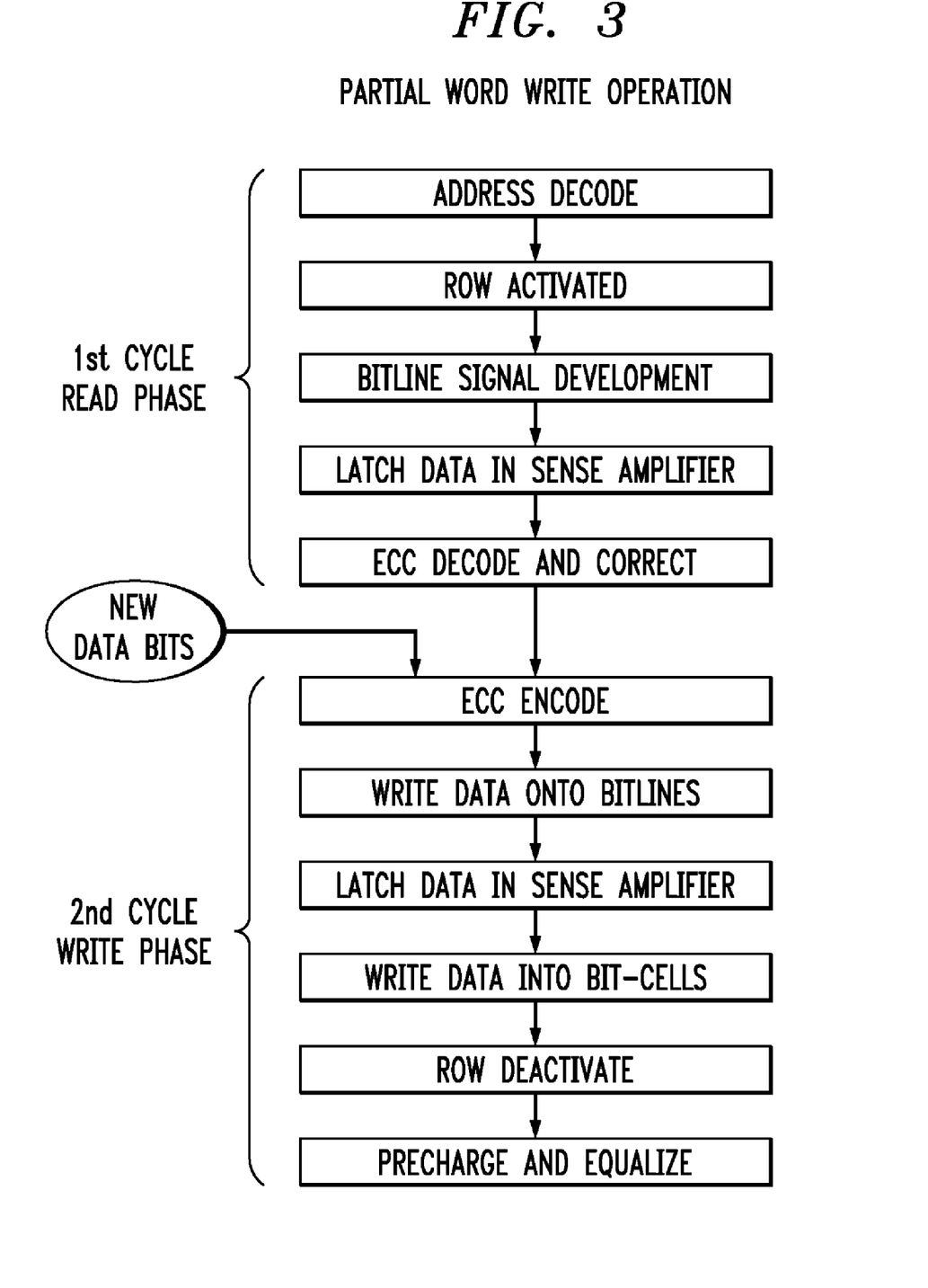

FIGS. 2 and 3 show two examples of partial word write operations that may be implemented in the memory device 100. Each includes a read phase and a write phase, these phases being associated with respective first and second clock cycles of the memory device. As previously described, the first cycle or read phase of a partial word write operation is a read and correction of the codeword that is to be partially rewritten. The second cycle or write phase is the calculation of the new ECC word and writing of the new codeword. It should again be noted that this particular ECC arrangement and others referred to herein are presented by way of illustrative example and not intended to limit the scope of the invention in any way.

Referring initially to FIG. 2, the read phase of the partial word write operation in this example comprises steps for address decode, row activated, bitline signal development, latch data in sense amplifier, row deactivated, precharge and equalize, and ECC decode and correct. Precharge and equalize involves resetting the bitlines and sense amplifiers to preset voltage levels. The write phase of the partial word write operation as shown in FIG. 2 comprises steps for ECC encode, write data onto bitlines, latch write data into sense amplifier and activate row, write data into bit-cells, row deactivate, and precharge and equalize. The new data bits shown as entering the ECC encode step are the data bits to be written in the partial word write operation.

The partial word write operation as shown in FIG. 3 is similar to that of FIG. 2, but the row is not deactivated at the end of the first cycle. The row instead remains active into the second cycle, and precharge and equalize does not occur between the first and second cycles.

It is to be appreciated that the particular partial word write operations shown in FIGS. 2 and 3 are presented by way of illustrative example only. The present invention can be implemented using other types of partial word write operations that include read and write phases.

Figure 4:
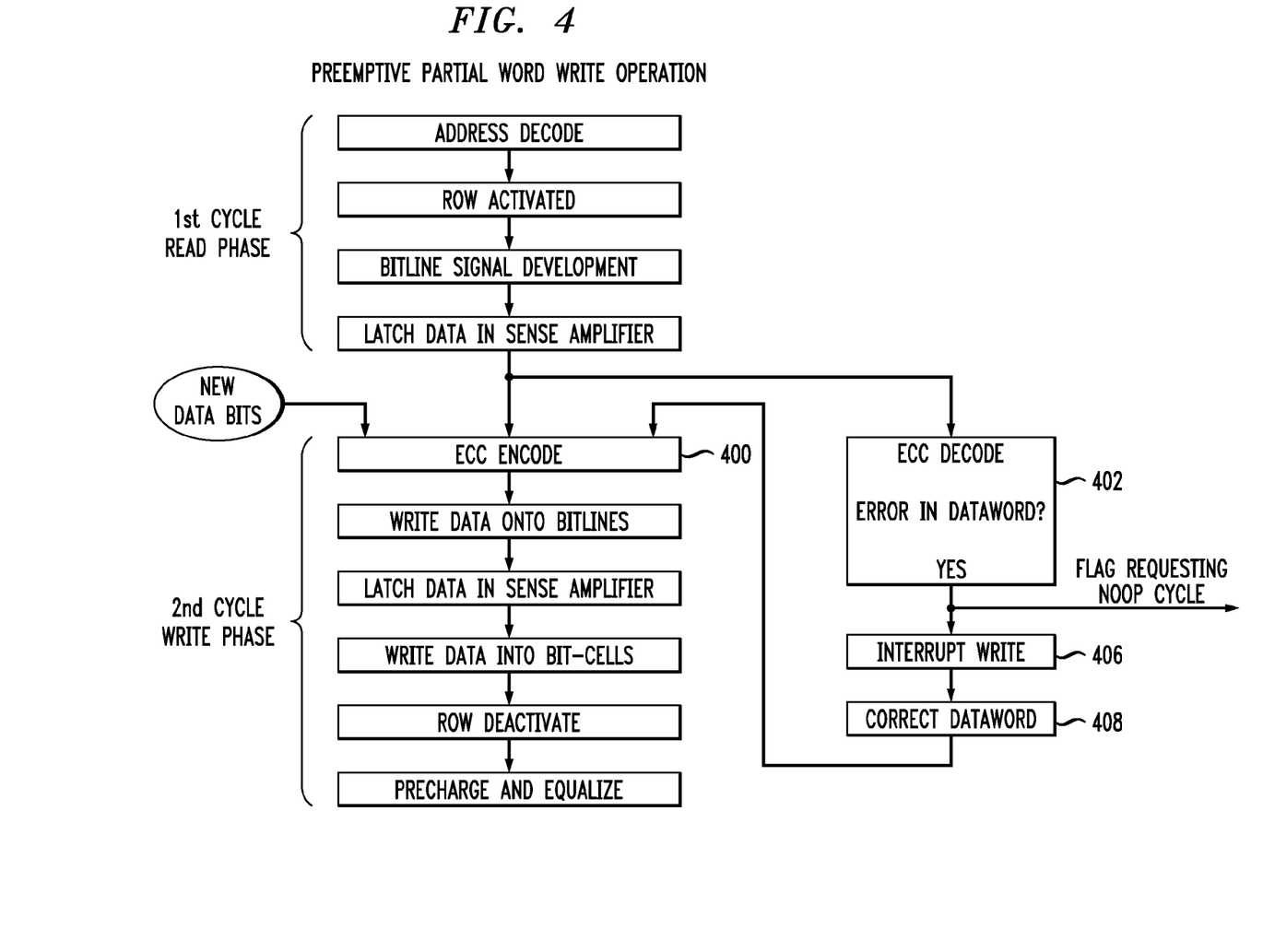
FIG. 4 shows a preemptive partial word write operation in an illustrative embodiment of the invention.

FIG. 4 shows a preemptive partial word write operation in which an ECC encode process of the partial word write operation is initiated for a given retrieved word prior to completion of an ECC decode process for the given retrieved word based on an assumption that the ECC decode operation will not indicate an error in the given retrieved word. This preemptive partial word operation is a modification of the FIG. 3 partial word write operation, but alternative preemptive partial word operations may be based on similar modifications of other types of partial word write operations, such as that shown in FIG. 2.

The preemptive partial word write operation in this embodiment includes a read phase and a write phase, but the ECC decode and correct processes of the FIG. 3 arrangement are removed from the critical timing path. An ECC encode process 400 of the partial word write operation is initiated for a given retrieved dataword prior to completion of an ECC decode process 402 for the given retrieved dataword. The ECC decode process for the given retrieved dataword is thus performed at least in part in parallel with the ECC encode process for the given retrieved dataword. In this embodiment, it is assumed that the ECC encode process includes modifying one or more bits of the given retrieved dataword in accordance with new data to be written by the partial word write operation and computing an ECC word for the modified retrieved dataword. Other embodiments may utilize other types of ECC encode processes. For example, as mentioned previously, modification of a given retrieved dataword based on new data may be performed outside of an ECC encode process for that retrieved dataword.

As indicated above, this advantageous preemptive approach assumes that the ECC decode process 402 will usually not indicate an error in the retrieved dataword. Thus, if no error is detected, the partial word write continues uninterrupted to completion and the correct ECC word is written along with the new bits in the dataword. There is no delay in this operation due to error detection or correction.

However, if there is a single bit error in the retrieved dataword, an incorrect ECC word would be written unless the partial word write operation is interrupted. Thus, if the ECC decode process 402 does in fact indicate an error in the retrieved dataword, the write phase is interrupted as indicated at 406, and the error in the retrieved dataword is corrected as indicated at 408. The ECC encode process 400 is then restarted using the corrected dataword.

In conjunction with the interruption of the write phase, a flag is generated that requests a NOOP cycle for the memory device. This NOOP cycle is utilized to restart and complete the write phase using the corrected dataword determined at 408. The flag requesting the NOOP cycle tells a higher-level system utilizing the memory device that one clock cycle of additional time is required to recover from the detected error in the retrieved dataword.

As noted previously, it is expected that only a small percentage of retrieved datawords will contain errors, typically much less than 0.1% of the retrieved datawords. Thus, the additional NOOP cycle will be requested infrequently. The time required for most partial word write operations will be considerably reduced.

A given memory device configured in accordance with the present invention may be implemented as a stand-alone memory device, for example, a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory of a microprocessor, central processing unit (CPU), digital signal processor (DSP), application-specific integrated circuit (ASIC), or other type of processor or integrated circuit device.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Again, it should be emphasized that the above-described embodiments of the invention are intended to be illustrative only. For example, other embodiments can use different types and arrangements of memory arrays, error correction circuitry and associated logic and structural elements for implementing the described functionality. As a more particular example, different types of ECC configurations may be used. Also, the particular steps associated with a given partial word write operation can be varied to suit the needs of a given application. These and numerous other alternative embodiments within the scope of the following claims will be apparent to those skilled in the art.

What is claimed is:

1. A memory device comprising:
   a memory array having a plurality of memory cells; and
   error correction circuitry coupled to the memory array and configured to process words retrieved from the memory array;
   said memory device being configured to perform a partial word write operation wherein an error correction code encode process for a given retrieved word is initiated prior to completion of an error correction code decode process for the given retrieved word based on an assumption that the error correction code decode process will not indicate an error in the given retrieved word, and further wherein if the error correction code decode process when, completed indicates an error in the given retrieved word, the error in the given retrieved word is corrected in the error correction circuitry, and the error correction code encode process is restarted using the corrected word.

2. The memory device of claim 1 wherein the error correction code encode process comprises modifying one or more bits of a given retrieved dataword in accordance with new data to be written by the partial word write operation and computing an error correction code word for the modified retrieved dataword.

3. The memory device of claim 1 wherein the error correction code decode process for the given retrieved word is performed at least in part in parallel with the error correction code encode process for the given retrieved word.

4. The memory device of claim 1 wherein the error correction code decode process and an associated correct process are removed from a critical timing path of the partial word write operation.

5. The memory device of claim 1 wherein the partial word write operation comprises a read phase and a write phase.

6. The memory device of claim 5 wherein the error correction code encode process and the error correction code decode process are performed at least in part in parallel with one another as part of the write phase of the partial word write operation.

7. The memory device of claim 6 wherein the write phase is interrupted if the error correction code decode process indicates an error in the given retrieved word.

8. The memory device of claim 7 wherein the write phase is interrupted in conjunction with generation of a flag that requests a no-operation cycle for the memory device.

9. The memory device of claim 8 wherein the requested no-operation cycle is utilized to restart and complete the write phase using a corrected word.

10. The memory device of claim 1 wherein the partial word write operation comprises at least one of a byte write operation and a bit write operation.

11. The memory device of claim 1 wherein the memory device comprises a stand-alone memory device.

12. The memory device of claim 1 wherein the memory device comprises an embedded memory device.

13. An integrated circuit comprising a memory device and additional circuitry coupled to the memory device, said memory device comprising:
a memory array having a plurality of memory cells; and
error correction circuitry coupled to the memory array and configured to process words retrieved from the memory array;
said memory device being configured to perform a partial word write operation wherein an error correction code encode process for a given retrieved word is initiated prior to completion of an error correction code decode process for the given retrieved word based on an assumption that the error correction code decode process will not indicate an error in the given retrieved word, and further wherein if the error correction code decode process when completed indicates an error in the given retrieved word, the error in the given retrieved word is corrected in the error correction circuitry, and the error correction code encode process is restarted using the corrected word.

14. The integrated circuit of claim 13 wherein said additional circuitry comprises a processor.

15. The integrated circuit of claim 13 wherein the error correction code decode process and an associated correct process are removed from a critical timing path of the partial word write operation.

16. A method for use in a memory device comprising a memory array having a plurality of memory cells, the memory device further comprising error correction circuitry coupled to the memory array and configured to process words retrieved from the memory array, the method comprising the step of:
performing a partial word write operation in which an error correction code encode process for a given retrieved word is initiated prior to completion of an error correction code decode process for the given retrieved word based on an assumption that the error correction code decode process will not indicate an error in the given retrieved word, and further wherein if the error correction code decode process when completed indicates an error in the given retrieved word, the error in the given retrieved word is corrected in the error correction circuitry, and the error correction code encode process is restarted using the corrected word.

17. The method of claim 16 wherein the partial word write operation comprises a read phase and a write phase, the method further including the step of interrupting the write phase if the error correction code decode process indicates an error in the given retrieved word.

18. The method of claim 17 wherein the step of interrupting the write phase further comprises the step of generating in conjunction with the interruption of the write phase a flag that requests a no-operation cycle for the memory device.

19. The method of claim 18 further comprising the step of utilizing the no-operation cycle to restart and complete the write phase using a corrected word.

20. An article of manufacture comprising a processor-readable storage medium having embodied therein software code for implementing a method for use in a memory device comprising a memory array having a plurality of memory cells, the memory device further comprising error correction circuitry coupled to the memory array and configured to process words retrieved from the memory array, the method comprising the step of:
performing a partial word write operation in which an error correction code encode process for a given retrieved word is initiated prior to completion of an error correction code decode process for the given retrieved word based on an assumption that the error correction code decode process will not indicate an error in the given retrieved word, and further wherein if the error correction code decode process when completed indicates an error in the given retrieved word, the error in the given retrieved word is corrected in the error correction circuitry, and the error correction code encode process is restarted using the corrected word.

21. A memory device comprising:
a memory array having a plurality of memory cells; and
error correction circuitry coupled to the memory array and configured to process datawords and error correction words retrieved from the memory array;
said memory device being configured to perform a partial word write operation in which a first dataword and an associated first error correction word are retrieved from the memory array, and one or more bits of the first dataword are modified to produce a second dataword, wherein a second error correction word is determined for the second dataword before a determination is made based on the first error correction word as to whether or not the first dataword contains an error.

22. A method for use in a memory device comprising a memory array having a plurality of memory cells, the memory device further comprising error correction circuitry coupled to the memory array and configured to process datawords and error correction words retrieved from the memory array, the method comprising the step of:

performing a partial word write operation in which a first dataword and an associated first error correction word are retrieved from the memory array, and one or more bits of the first dataword are modified to produce a second dataword, wherein a second error correction word is determined for the second dataword before a determination is made based on the first error correction word as to whether or not the first dataword contains an error.

* * * * *